(12) United States Patent
Yeo et al.

(10) Patent No.: US 9,502,956 B1
(45) Date of Patent: Nov. 22, 2016

(54) CONFIGURATION OF SEMICONDUCTOR DEVICE SUPPLY VOLTAGE

(71) Applicant: ClariPhy Communications, Inc., Irvine, CA (US)

(72) Inventors: Michael Yeo, Irvine, CA (US); Norman L. Swenson, Mountain View, CA (US)

(73) Assignee: ClariPhy Communications, Inc., Irvine, CA (US)

( * ) Notice: Subject to any disclaimer, the term of this patent is extended or adjusted under 35 U.S.C. 154(b) by 220 days.

(21) Appl. No.: 14/133,552

(22) Filed: Dec. 18, 2013

Related U.S. Application Data

(60) Provisional application No. 61/739,613, filed on Dec. 19, 2012.

(51) Int. Cl.
| | | |
|---|---|---|
| *G01R 31/02* | (2006.01) | |
| *G01R 31/26* | (2014.01) | |
| *H02M 1/36* | (2007.01) | |
| *G01R 31/28* | (2006.01) | |
| *G01R 31/317* | (2006.01) | |

(52) U.S. Cl.
CPC .............. *H02M 1/36* (2013.01); *G01R 31/26* (2013.01); *G01R 31/2642* (2013.01); *G01R 31/2648* (2013.01); *G01R 31/2851* (2013.01); *G01R 31/2831* (2013.01); *G01R 31/3172* (2013.01)

(58) Field of Classification Search
CPC ... H01L 2924/00; H01L 22/14; H01L 22/34; G01R 31/2601; G01R 31/26; G01R 31/2853; G01R 31/2851; G01R 31/2642; G01R 31/2648; G01R 31/2831; G01R 31/31702

USPC ......... 324/71, 378, 403, 415, 425, 500, 537, 324/762.01
See application file for complete search history.

(56) References Cited

U.S. PATENT DOCUMENTS

| | | | | |
|---|---|---|---|---|
| 2004/0128566 A1* | 7/2004 | Burr | ...................... | G06F 1/3203 713/300 |
| 2004/0128567 A1* | 7/2004 | Stewart | ................. | G06F 1/3203 713/300 |
| 2005/0004718 A1* | 1/2005 | Issa | ...................... | G06F 17/5031 700/304 |
| 2005/0062507 A1* | 3/2005 | Naffziger | .................. | H03L 7/07 327/105 |
| 2006/0132190 A1* | 6/2006 | Driediger | ............... | G01R 23/10 327/47 |
| 2008/0013668 A1* | 1/2008 | Willis | ................ | G01R 29/0273 377/56 |
| 2008/0100328 A1* | 5/2008 | Dhong | ............... | G01R 31/3004 324/750.3 |
| 2010/0144286 A1* | 6/2010 | Sorensen | .............. | H03F 1/0261 455/73 |

\* cited by examiner

*Primary Examiner* — Huy Q Phan
*Assistant Examiner* — Paul Rios Russo
(74) *Attorney, Agent, or Firm* — Fenwick & West LLP

(57) ABSTRACT

A calibration process determines a desired supply voltage for operating an electronic device. During the calibration process automatic test equipment controls a power supply to sweep the supply voltage to the electronic device across a predefined voltage range while monitoring a performance characteristic of the electronic device. The automatic test equipment determines the desired operating voltage based on a minimum supply voltage at which the monitored performance characteristic meets a minimum acceptable performance standard and stores the desired operating voltage to a non-volatile storage. During a startup sequence, the electronic device controls the power supply to provide the desired operating voltage as the supply voltage to the electronic device.

22 Claims, 5 Drawing Sheets

CONFIGURATION OF SEMICONDUCTOR DEVICE SUPPLY VOLTAGE

RELATED APPLICATIONS

This application claims the benefit of U.S. Provisional Patent Application Ser. No. 61/739,613 entitled "Method for Selecting Semiconductor Device Supply Voltages" filed on Dec. 19, 2012 to Michael Yeo, the content of which is incorporated by reference herein.

BACKGROUND

1. Field of the Art

The disclosure relates generally to semiconductors, and more specifically, to configuring a supply voltage in a semiconductor device.

2. Description of the Related Art

Power management is an important problem in semiconductor devices. In order to reduce power consumption of devices, it is often desirable to operate the devices at the lowest possible supply voltage at which the device will meet desired performance standards. However, because performance is also affected by manufacturing variations between devices, this ideal operating voltage may vary significantly between devices. Furthermore, the ideal operation voltage may vary between different supply voltages on the same device.

SUMMARY

An integrated circuit comprises an electronic device, a storage, and one or more process monitors. A power supply provides a supply voltage to the electronic device. The process monitors monitor a performance characteristic of the electronic device that varies based on the supply voltage. Automatic test equipment controls the power supply to sweep the supply voltage to the electronic device across a predefined voltage range. The automatic test equipment also monitors the performance characteristic of the electronic device while sweeping the supply voltage. The automatic test equipment determines a desired operating voltage based on a minimum supply voltage at which the monitored performance characteristic meets a minimum acceptable performance standard. The storage stores the desired operating voltage.

The electronic device is configured to execute a startup sequence upon power on. In this process, the electronic device controls the power supply to initialize the supply voltage to the electronic device to an initial voltage above the desired operating voltage. The electronic device reads the desired operating voltage from the storage, and configures the power supply to provide the desired operating voltage as the supply voltage to the electronic device.

BRIEF DESCRIPTION OF THE DRAWINGS

The invention has other advantages and features which will be more readily apparent from the following detailed description of the invention and the appended claims, when taken in conjunction with the accompanying drawings, in which:

DETAILED DESCRIPTION

Figure 1:
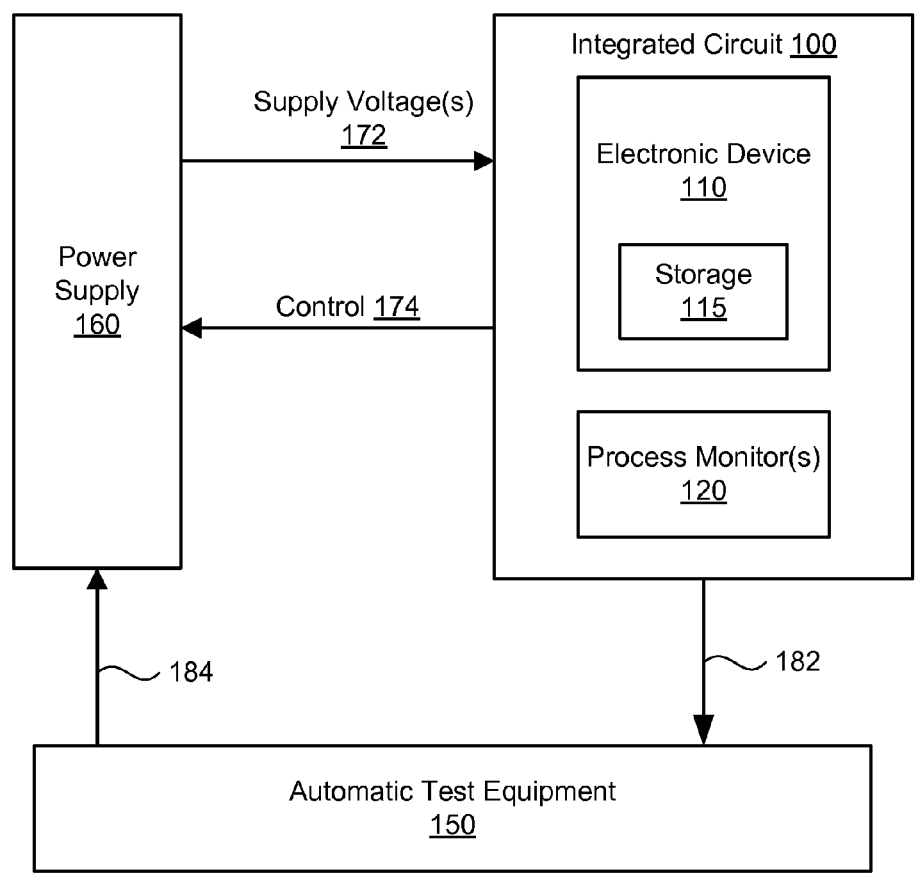
FIG. 1 is a block diagram of an embodiment of an electronic system.

FIG. 1 illustrates an embodiment of an electronic system in which a power supply 160 provides power to an integrated circuit 100 via one or more supply voltages 172 based on a control signal 174 received from the integrated circuit 100. Generally, the power supply 160 is controlled to provide the minimum allowable supply voltages 172 that enable the integrated circuit 100 to meet a minimum performance standard, thereby optimizing power efficiency of the integrated circuit 100. In a calibration phase, the integrated circuit 100 and power supply 160 are controlled by automatic test equipment 150 to determine the supply voltages 172.

The integrated circuit 100 comprises an electronic device 110 including storage 115, and one or more on-chip process monitors 120. The electronic device 110 can comprise any transistor-based device such as, for example, a transmitter device, a receiver device, a transceiver device, a processing device, a controller device, etc. The storage 115 of the electronic device 110 stores calibration parameters of the electronic device 110 such as one or more supply voltages for operating the electronic device 110. The storage 115 may comprise a non-volatile storage such as, for example, an electronically-erasable programmable read only memory (EEPROM), FLASH memory, or eFUSE memory, which can be programmed by the automatic testing 150 discussed below. The integrated circuit 100 provides one or more control signals 174 to the power supply 160 to control the supply voltage level that the power supply 160 provides to the electronic device 110 and the process monitors 120 based on the calibration parameters in storage 115.

The one or more process monitors 120 detect parameters associated with process variations of the integrated circuit 100 which affect performance of the electronic device 110. For example, in one embodiment, the one or more process monitors 120 detect a speed of the electronic device 110. The speed of the electronic device 110 is affected by the supply voltage(s) applied to the electronic device 110, process variations that affect attributes of transistors (e.g., lengths, widths, thicknesses, n-type and p-type doping concentration, etc.) in the electronic device 110, and environmental effects such as temperature. Assuming environmental effects are minimal, the relationship between speed and supply voltage is characterized by the process variations and may vary from chip to chip.

In one embodiment, the one or more process monitors 120 each comprise a ring oscillator or other oscillating circuit. The process monitor 120 characterizes the oscillation frequency as a measure of speed. By placing one or more process monitors 120 on the same semiconductor wafer as the electronic device 110 within the integrated circuit 100, the oscillation frequency of the process monitor 120 is representative of the speed of the electronic device 110.

Figure 3:
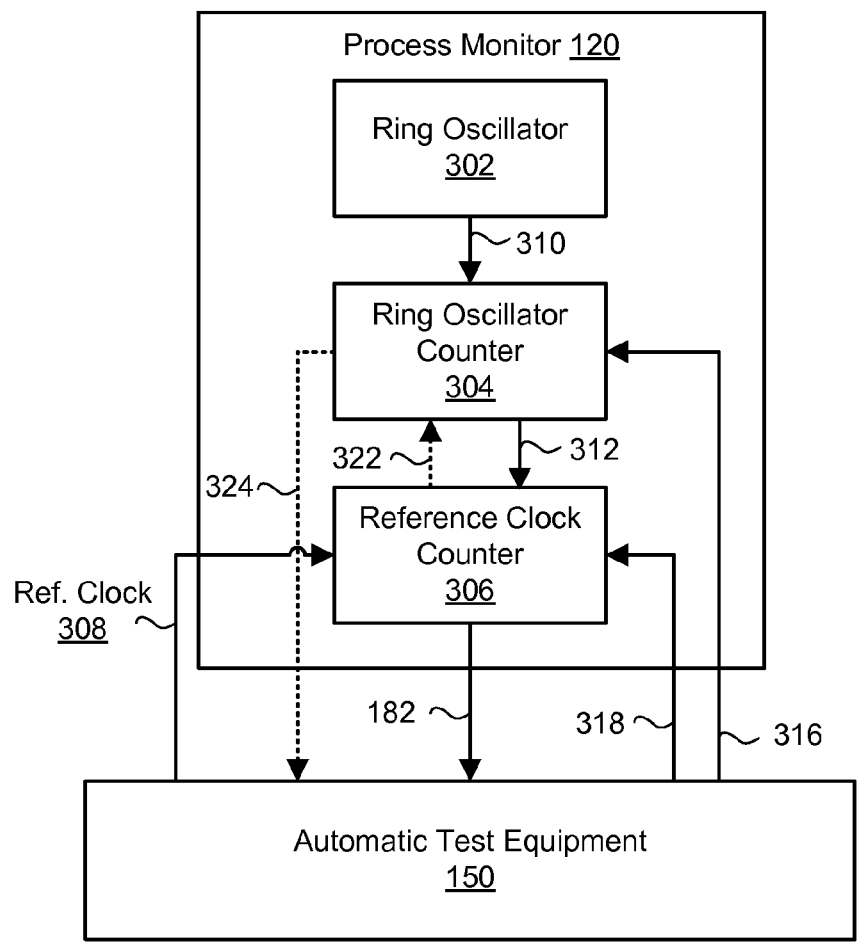
FIG. 3 is a block diagram illustrating an example embodiment of a process monitor.

Automatic testing equipment 150 comprises one or more devices used during a calibration process to calibrate the integrated circuit 100 to account for process variations between devices. During the calibration process, the automatic testing equipment 150 controls the power supply 160 via control signal 184 to vary the supply voltage 172 while monitoring the performance characteristics (received via signal 182) determined by the process monitor 120. Additional connections between the automatic test equipment 150 and the process monitor 150 are omitted from FIG. 1 for clarity of description, but are illustrated in FIG. 3 discussed below. The automatic testing equipment then determines the minimum supply voltage for a given integrated circuit 100 that will enable the electronic device 110 to meet the desired performance standard. The minimum performance standard may be determined based on a static timing analysis of the integrated circuit 100. The minimum performance standard may also be based on performance statistics measured in the integrated circuit 100 or by automatic test equipment 150 using data interfaces not shown in FIG. 1. Examples of such performance statistics include, for example, bit error rate performance in the case where the electronic device 100 comprises a transceiver. The minimum supply voltage to achieve the minimum performance standard is stored to storage 115. In embodiments where the electronic device 110 uses multiple supply voltages, a minimum supply voltage is stored for each supply voltage used by the electronic device 110. Then, during startup operation of the electronic device 110, the power supply 160 reads the one or more supply voltages from the storage (e.g., via control signal 174) and provides the appropriate supply voltage(s) 172 to power the electronic device 110. Examples of a calibration process and a startup process are described in further detail below.

Although the example in FIG. 1 shows the integrated circuit 100 interacting with the automatic test equipment 150 and power supply 160 directly, other embodiments may include one or more additional intermediate components to facilitate these interactions. For example, in one embodiment, a field-programmable gate array (FPGA) or microprocessor interfaces to the integrated circuit 100 using a data bus such as, for example, a Serial Peripheral Interface (SPI). In this embodiment, the FPGA or microprocessor collects data from the process monitors 120, writes data to storage 115, reads data from storage 115, and generates the control signal 184 to control the power supply 160 based on the observed data.

Furthermore, the power supply 160 used during calibration may be different than the power supply 160 used during field operation. Similarly, the microprocessor or FPGA, if present, used during calibration may be different than the microprocessor or FGPA used in field operation. For example, in one embodiment, the FPGA or microprocessor and power supply 160 resides in the automatic test equipment 150 during calibration of the integrated circuit 100. During field operation, the FPGA or microprocessor and the power supply 160 may reside in a module, linecard, or other system-based product.

Figure 2:
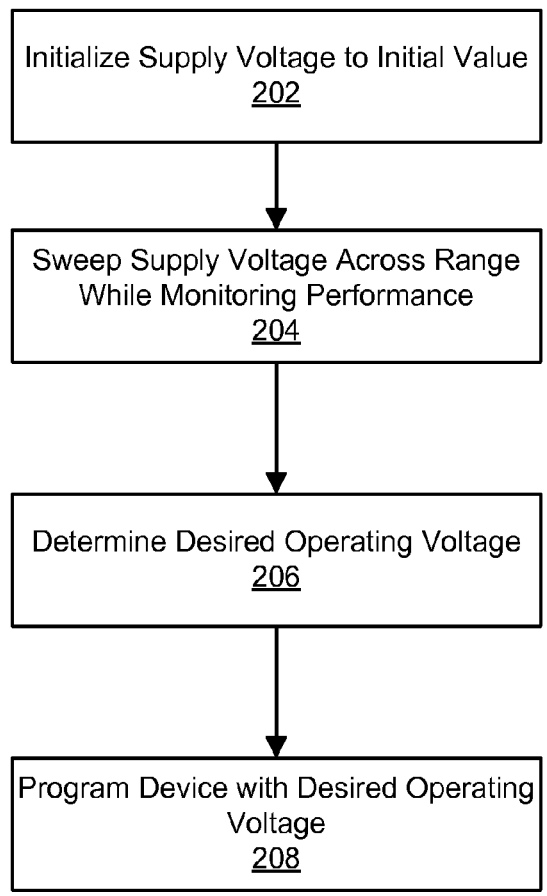
FIG. 2 is a flowchart illustrating an embodiment of a process for determining a supply voltage for operating an electronic device.

FIG. 2 illustrates an embodiment of a process for characterizing the relationship between speed and voltage of an electronic device 110. This process is typically performed at manufacture time, but in some embodiments, may also be performed periodically after manufacture to re-calibrate the electronic device 110. The automatic testing equipment 150 initializes 202 the supply voltage 172 of the power supply 160 to an initial voltage. In one embodiment, the initial voltage comprises a maximum voltage in a predefined voltage range. By initializing the power supply to the maximum voltage in the predefined voltage range, it is ensured that the integrated circuit 100 will have sufficient supply voltage to operate properly at the beginning of the calibration process. However, in other embodiments, the initial voltage may comprise, for example, a minimum voltage of the predefined voltage range, or another predefined voltage. The automatic testing equipment 150 then sweeps 204 the supply voltage 172 across the predefined voltage range (e.g., in fixed or variable increments) and at each step, monitors performance characteristics of the electronic device 110 using data from the process monitors 120.

For example, in one embodiment, the automatic testing equipment 150 receives a speed measurement from the process monitor 120 as it sweeps the voltage across the voltage range, and the automatic testing equipment 150 determines whether or not the speed meets the minimum performance standard. In another embodiment, the automatic testing equipment 150 receives a binary value from the process monitor 120 that indicates whether or not the minimum performance standard is met. In one embodiment, the sweep is performed at 0.01V increments although in alternative embodiments, a finer or coarser step size may be used. Furthermore, in alternative embodiments, the sweep may be performed in either direction (e.g., from high to low or from low to high).

In another alternative embodiment, instead of performing a simple voltage sweep, a more efficient search process may be used. For example, in one embodiment, the automatic testing equipment 150 receives a value from the process monitor 120 indicating how fast or how slow the integrated circuit 100 is relative to the desired speed that meets the minimum performance standard. The automatic testing equipment 150 can then adjust the supply voltage by an amount based on the value indicating how fast or how slow the integrated circuit 100 is relative to the desired speed. This technique allows the automatic testing equipment 150 to locate the desired operating voltage more quickly. In another embodiment, a different search technique may be used without necessarily using specific values from the process monitor 120 that indicate how fast or how slow the integrated circuit 100 is relative to the desired speed. For example, in one embodiment, a binary search technique is used to find the minimum supply voltage to achieve the desired speed in a manner that may be more efficient than a simple sweep. Other techniques for determining the desired supply voltage will be apparent to those of ordinary skill in the art.

Based on the monitored characteristics, the automatic testing equipment 150 determines 206 the desired operating voltage. In one embodiment, the desired operating voltage comprises the minimum voltage at which the minimum acceptable speed is met. For example, if the voltage is swept from low to high, the automatic testing equipment 150 identifies the voltage at which the speed first exceeds a predefined speed threshold. Alternatively, if the voltage is swept from high to low, the automatic testing equipment 150 identifies the last voltage before the speed drops below the predefined speed threshold. In other embodiments, the desired operating voltage may be set at a predefined threshold above the minimum voltage. The determined voltage is then programmed 208 to a register in the storage 115. The process of FIG. 2 may repeat for additional supply voltages used by the transceiver 110. Alternatively, the process of FIG. 2 may be performed in parallel, interleaved threads, or round robin in succession until a solution is reached, for multiple supply voltages.

FIG. 3 illustrates an example embodiment of a process monitor 120. In one embodiment, the process monitor 120 includes a ring oscillator 302, a ring oscillator counter 304, and a reference counter 306. The reference counter 306 operates based on an external reference clock signal 308 provided by the automatic test equipment 150. The ring oscillator counter 304 operates based on a ring oscillator clock signal 310 generated by the ring oscillator 302. The frequency of the ring oscillator clock signal 310 depends on process, supply voltage, and temperature. In one embodiment, both the ring oscillator counter 304 and reference counter 306 count down from a predefined seed value (which may be different for the ring oscillator counter 304 and the reference counter 306) to zero, decrementing for each clock cycle. When the ring oscillator counter 304 reaches zero, it asserts signal 312 to "freeze" the reference clock counter 306 at its current value. In one embodiment, the reference clock counter 306 outputs signal 182 indicating its current count value. In an alternative embodiment, signal 182 indicates whether its current count value is zero or non-zero without necessarily indicating the count value. In one embodiment, signal 182 is updated only when signal 312 is asserted to freeze the reference clock counter 306. In other embodiments, the reference clock counter 306 updates signal 182 periodically regardless of signal 312.

The seed values for the ring oscillator counter 304 and reference counter 306 may be selected based on a desired frequency of the ring oscillator clock 310, which represents, for example, a minimum acceptable speed of the integrated circuit 100. In one embodiment, the desired frequency of the ring oscillator clock 310 is determined by performing a static timing analysis to simulate the integrated circuit 100 and predict a minimum frequency of the ring oscillator clock 310 that will enable the nitrated circuit 100 to operate as desired. The reference clock frequency may be set based depending on design choice and may be chosen as a matter of convenience (e.g., to use a clock already available in a system including the integrated circuit 100).

The seed values for the ring oscillator counter 304 and reference counter 306 are then set (via signals 316, 318 respectively) to have a fixed relationship to each other based on the desired frequency and the reference clock frequency. For example, in one embodiment, the relationship between the ring oscillator counter seed value (ring_osc_counter_seed) and the reference counter seed value (ref_counter_seed) is set based on the desired lower bound on the ring oscillator clock frequency (ring_osc_clk_freq) and the reference clock frequency (ref_clk_freq) as follows:

$$ring\_osc\_counter\_seed = \frac{ring\_osc\_clk\_freq}{ref\_clk\_freq} ref\_counter\_seed$$

For example, if the desired lower bound on the ring oscillator frequency is 500 MHz, the reference clock frequency is 100 MHz, and a reference counter seed value of 100 is used, then the ring oscillator counter seed value is set to 500 in accordance with the equation above.

In operation, both counters 304, 306 begin counting down from their respective seed values. If the reference counter 306 is already at zero when the ring oscillator counter 304 reaches zero (and asserts signal 312), this means that the oscillator clock 310 does not meet the desired frequency at the given supply voltage and temperature. On the other hand, if the reference counter 306 is above zero when the ring oscillator counter 304 reaches zero, this indicates that the ring oscillator clock 310 meets or exceeds the desired frequency at the given supply voltage and temperature. Furthermore, the specific value remaining on the reference counter 306 when the ring oscillator counter 304 reaches zero provides an indication of how fast the ring oscillator clock 310 is relative to the desired frequency. In an embodiment, this information can be used to enable a more efficient search for the desired supply voltage that does not necessarily involve testing every supply voltage value in the process of FIG. 2.

In an alternative embodiment, an optional signal 322 is asserted by the reference clock counter 306 when the reference clock counter 306 reaches zero and acts to "freeze" the ring oscillator counter 304 at its present count value when asserted. In this embodiment, the frozen value of the ring oscillator counter 304 can be provided to automatic test equipment 150 via optional signal 324 and provides an indication of how slow the ring oscillator clock 310 is relative to the desired frequency. In an embodiment, this information can be used to enable a more efficient search for the desired supply voltage that does not necessarily involve testing every supply voltage value in the process of FIG. 2. In one embodiment, signals 312 and 182 may be omitted when signals 322 and 324 are present. Alternatively, both pairs of signals may be used in combination so that whichever counter 304, 306 reaches zero first freezes the other counter.

In another alternative embodiment, the counters 306, 308 may count up to respective threshold values instead of counting down. In this case, the threshold values can be set (e.g., via signals 318, 316 respectively) to appropriate values to enable the process monitor 120 to achieve the same general functionality described above.

In another alternative embodiment, the ring oscillator 302 comprises a different type of clock generator that is not necessarily a ring oscillator.

Figure 4:
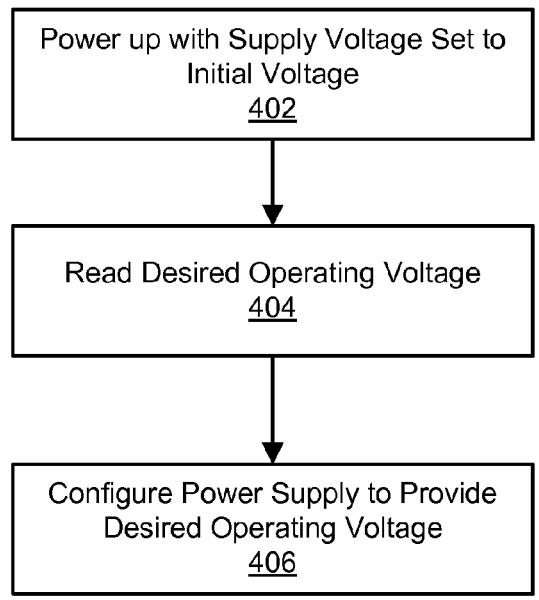
FIG. 4 is a flowchart illustrating an embodiment of a process for setting a supply voltage for operating an electronic device upon start up.

FIG. 4 illustrates an embodiment of a process for setting the supply voltage of the electronic device 110 during a startup process. The electronic device 110 powers on 402 with the supply voltage 172 set to an initial voltage. In one embodiment, the initial voltage is a maximum voltage within the allowable voltage range to ensure that the electronic device 110 will meet the minimum performance standard during the startup process. The electronic device 110 reads 404 the desired operating voltage from the programmed register of storage 120. The electronic device 110 then configures 406 the power supply 160 to supply the desired voltage to the electronic device 110. In embodiments where the electronic device 110 uses multiple supply voltages, the process of FIG. 4 may be repeated or performed in parallel for each of the supply voltages.

Figure 5:
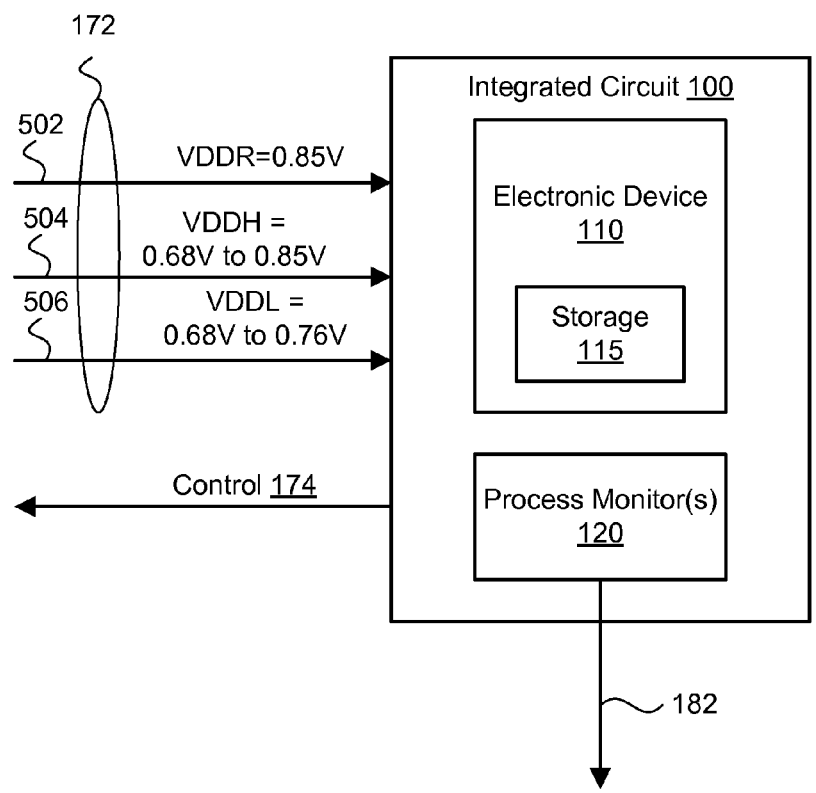
FIG. 5 is a block diagram illustrating example supply voltages associated with an embodiment of an electronic system.

FIG. 5 illustrates an example set of supply voltages 172 for supplying power to an integrated circuit 100. As described above control signal 174 and monitor signal 182 may pass through the SPI bus to be handled by an FPGA or microprocessor, in one embodiment. Alternatively, these signals 174, 182 may pass directly to a power supply 160 and automatic test equipment 150 respectively. In this example embodiment, the electronic device 110 comprises a transceiver device that uses three different supply voltages: a first supply voltage VDDR 502 for supplying power to a first set of digital logic components of the electronic device 110; a second supply voltage VDDH 504 for supplying power to a second set of digital logic components; and a third supply voltage VDDL 506 for supplying power to a third set of digital logic components. The first supply voltage VDDR 502 in this example embodiment has a fixed supply voltage of 0.85V that does not require calibration. The VDDH supply voltage 504 and VDDL supply voltage 506 are calibrated for each chip according to the processes described above. Thus, each chip may be configured to operate at a different VDDH supply voltage 504 and VDDL supply voltage 506 within respective predefined voltage ranges. In this example embodiment, the minimum supply voltage for the VDDH supply voltage 504 is 0.68V and the maximum supply voltage for the VDDH supply voltage is 0.85V. Furthermore, in this example embodiment, the minimum supply voltage for the VDDL supply voltage 506 is 0.68V and the maximum supply voltage for the VDDL supply voltage is 0.76V.

The allowable supply voltage ranges for the configurable supply voltages 504, 506 are determined based on a simulation of the electronic device 110. For example, in one embodiment, the simulation determines a predefined minimum and a predefined maximum voltage for each of the configurable supply voltages 504, 506.

In one embodiment, the minimum supply voltage is determined by simulating the electronic device at a 3σ fast-fast (FF) process corner, which represents an integrated circuit with transistors having doping concentrations (and other parameters) three standard deviations away from nominal doping concentrations such that carrier mobility for both NFETs and PFETs are higher than normal. During the simulation, the minimum supply voltage is determined as the voltage at which the simulated electronic device meets a given performance standard.

In one embodiment, the maximum supply voltage is similarly determined by simulating the electronic device at a 3σ slow-slow (SS) process corner, which represents an integrated circuit with transistors having doping concentrations (and other parameters) three standard deviations away from nominal doping concentrations such that carrier mobility for both NFETs and PFETs are slower than normal. During the simulation, the maximum supply voltage is determined as the voltage at which the simulated electronic device meets the given performance standard. In one embodiment, the voltage sweeps applied during the calibration phase of FIG. 2 are confined to these predefined minimum and maximum supply voltages.

In alternative embodiments, different standards may be used to determine the minimum and maximum supply voltages. For example, in one embodiment 6σ process corners may be used instead of 3σ process corners.

Although the detailed description contains many specifics, these should not be construed as limiting the scope but merely as illustrating different examples and aspects of the described embodiments. It should be appreciated that the scope of the described embodiments includes other embodiments not discussed in detail above. For example, the functionality of the various components and the processes described above can be performed by hardware, firmware, software, and/or combinations thereof.

Various other modifications, changes and variations which will be apparent to those skilled in the art may be made in the arrangement, operation and details of the method and apparatus of the described embodiments disclosed herein without departing from the spirit and scope of the invention as defined in the appended claims. Therefore, the scope of the invention should be determined by the appended claims and their legal equivalents.

The invention claimed is:

1. A method for determining a supply voltage for operating an electronic device of an integrated circuit, the method comprising:
sweeping the supply voltage across a voltage range;
monitoring a performance characteristic of the electronic device at a plurality of different time points while sweeping the supply voltage across the voltage range, wherein monitoring the performance characteristic at a given time point of the plurality of different time points comprises:
counting a number of cycles of a first clock signal;
counting of a number of cycles of a second clock signal;
generating an indicator signal responsive to a threshold number of cycles of the first clock signal being reached;
stopping counting of the number of cycles of the second clock signal responsive to the indicator signal indicating that the threshold number of cycles of the first clock signal has been reached; and
outputting the number of clock cycles of the second clock signal counted prior to the indicator signal being generated as the performance characteristic associated with the given time point;
identifying a minimum voltage at which the performance characteristic achieves a predefined performance level; and
storing the identified minimum voltage to a register of the electronic device.

2. The method of claim 1, wherein sweeping the supply voltage across the voltage range comprises:
sweeping the supply voltage from a minimum voltage of the voltage range to a maximum voltage of the voltage range.

3. The method of claim 1, wherein sweeping the supply voltage across the voltage range comprises:
sweeping the supply voltage from a maximum voltage of the voltage range to a minimum voltage of the voltage range.

4. The method of claim 1, wherein monitoring the performance characteristic of the electronic device comprises:
measuring an oscillation speed of a ring oscillator in the integrated circuit.

5. The method of claim 1, further comprising:
determining the predefined performance level based on a static timing analysis of the electronic device.

6. The method of claim 1, wherein the register comprises a non-volatile memory.

7. The method of claim 1 wherein the first clock signal comprises a ring oscillator clock signal generated by a ring oscillator, and wherein the second clock signal comprises an external reference clock signal.

8. The method of claim 1, wherein the second clock signal comprises a ring oscillator clock signal generated by a ring oscillator, and wherein the first clock signal comprises an external reference clock signal.

9. The method of claim 1, wherein counting the number of cycles of the first clock signal comprises using a first counter to count down to zero from a first seed value, and wherein counting the number of cycle of the second clock signal comprises using a second counter to count down from a second seed value, the indicator signal being asserted when the first counter reaches zero.

10. The method of claim 9, wherein outputting the performance characteristics comprises:
outputting a first predefined value responsive to the second counter being zero when the first counter reaches zero; and
outputting a second predefined value responsive to the second counter being a non-zero value when the first counter reaches zero.

11. The method of claim 9, wherein outputting the performance characteristic comprises:

outputting a value of the second counter when the first counter reaches zero.

12. An electronic system, comprising:
an electronic device of an integrated circuit;
a power supply to provide a supply voltage to the electronic device;
a process monitor of the integrated circuit, the process monitor to monitor a performance characteristic of the electronic device at a plurality of different time points, wherein the process monitor comprises:
   a first counter to count a number of cycles of a first clock signal and to output an indicator signal responsive to a threshold number of cycles of the first clock signal being reached;
   a second counter to count a number of cycles of a second clock signal and to stop counting responsive to the indicator signal indicating that the threshold number of cycles of the first clock signal has been reached, and to output the number of clock cycles of the second clock signal counted prior to the indicator signal being generated as the performance characteristics associated with the given time point; and
automatic test equipment to control the power supply to sweep the supply voltage to the electronic device across a predefined voltage range, and to receive the performance characteristic of the electronic device while sweeping the supply voltage, the automatic test equipment to determine a desired operating voltage based on a minimum supply voltage at which the performance characteristic meets a minimum acceptable performance standard;
a storage of the integrated circuit to store the desired operating voltage.

13. The electronic system of claim 12, wherein the automatic testing equipment sweeps the supply voltage from a minimum voltage of the voltage range to a maximum voltage of the voltage range.

14. The electronic system of claim 12, wherein the automatic testing equipment sweeps the supply voltage from a maximum voltage of the voltage range to a minimum voltage of the voltage range.

15. The electronic system of claim 12, wherein the process monitor comprises:
a ring oscillator to provide an oscillating signal, wherein the performance characteristic comprises a speed of the oscillating signal.

16. The electronic system of claim 12, wherein the storage comprises a non-volatile storage.

17. The electronic system of claim 12, wherein the electronic device is configured to execute a startup sequence upon power on, the startup sequence comprising steps of:
initializing the supply voltage to the electronic device to an initial voltage, the initial voltage above the desired operating voltage for the electronic device;
reading the desired operating voltage for the electronic device from the storage; and
configuring the power supply to provide the desired operating voltage as the supply voltage to the electronic device.

18. The electronic system of claim 12, wherein the process monitor further comprises:
a ring oscillator to generate the first clock signal; and
wherein the second clock signal comprises an external reference clock signal.

19. The electronic system of claim 12, further comprising:
a ring oscillator to generate the second clock signal; and
wherein the first clock signal comprises an external reference clock signal.

20. The electronic system of claim 12, wherein first counter is configured to count down from a first seed value, and wherein the second counter is configured to count down from a second seed value, the indicator signal being asserted when the first counter reaches zero.

21. The electronic system of claim 12, wherein the reference clock counter is further configured to:
output a first predefined value responsive to the second counter being zero when the first counter reaches zero; and
output a second predefined value responsive to the second counter being a non-zero value when the first counter reaches zero.

22. The electronic system of claim 12, wherein the second counter is further configured to output a value of the second counter when the first counter reaches zero.

* * * * *